United States Patent [19]

Berman

[11] 3,862,352

[45] Jan. 21, 1975

[54] PHOTOGRAPHICALLY PREPARED ELECTRICAL CIRCUITS WHEREIN THE PHOTOSENSITIVE MATERIAL IS A PHOTOCONDUCTOR

[75] Inventor: Elliot Berman, Quincy, Mass.

[73] Assignee: Itek Corporation, Lexington, Mass.

[22] Filed: Apr. 16, 1968

[21] Appl. No.: 721,778

[52] U.S. Cl. .............. 174/68.5, 96/36.2, 317/101 B

[51] Int. Cl. ........ H05k 1/00, G03c 5/00, H02b 1/04

[58] Field of Search .... 174/68.5; 317/101 B, 101 C, 317/101 D; 96/38.4, 64, 36, 36.2, 27 F, 98 PD; 101/451; 117/213, 212

[56] References Cited

UNITED STATES PATENTS

| | | | |
|---|---|---|---|
| 3,081,165 | 3/1963 | Ebert | 96/1 |
| 3,106,156 | 10/1963 | Reithel | 101/458 |
| 3,152,903 | 10/1964 | Shepard et al. | 96/64 |
| 3,223,525 | 12/1965 | Jonker et al. | 96/36.2 |
| 3,380,823 | 4/1968 | Gold | 96/48 X |
| 3,384,485 | 5/1968 | Blake | 96/64 |
| 3,424,581 | 1/1969 | Nawn et al. | 96/38.4 |
| 3,424,582 | 1/1969 | Berman et al. | 96/48 |
| 3,451,813 | 6/1969 | Kinney et al. | 96/36.2 |
| 3,464,822 | 9/1969 | Blake | 96/36.2 X |

FOREIGN PATENTS OR APPLICATIONS

| | | |
|---|---|---|
| 1,043,250 | 9/1966 | Great Britain |
| 6,712,933 | 3/1969 | Netherlands |

*Primary Examiner*—Norman G. Torchin
*Assistant Examiner*—M. F. Kelley
*Attorney, Agent, or Firm*—Homer O. Blair; Robert L. Nathans; W. Gary Goodson

[57] ABSTRACT

A printed production process wherein the latent image of a desired circuit is exposed on a film of photoconductive material and then the latent image is developed into an electrically conductive circuit image.

10 Claims, 4 Drawing Figures

PATENTED JAN 21 1975 3,862,352

Inventor:
Elliot Berman,
by John E. Taupal
Attorney

PHOTOGRAPHICALLY PREPARED ELECTRICAL CIRCUITS WHEREIN THE PHOTOSENSITIVE MATERIAL IS A PHOTOCONDUCTOR

BACKGROUND OF THE INVENTION

This invention relates generally to printed circuits and more specifically relates to photographically developed circuits and to the method for their production.

Printed circuits are the foundation for most mechanically fabricated electronic equipment. The popularity of printed circuitry stems primarily from the reduced labor requirements associated with its use. In addition, the high degree of repeatability possible with printed circuits improves system uniformity and simplifies quality control of the finished product. Furthermore, the precision with which they can be manufactured renders printed circuits particularly useful in miniature electronic units now used in many applications such as those involving airborne equipment.

The most common printed circuit production methods involve material removal processes. Of these, a very popular technique is photo etching wherein photographic film is utilized to form the circuit. A photosensitive film is applied to a copper layer bonded on a plastic laminate and a negative of a desired circuit pattern is superimposed on the film. Then, the film is exposed to ultraviolet light which hardens the exposed circuit image. Next, the unit is placed in an alcohol bath that dissolves only the unexposed film leaving the hardened exposed film to protect the copper layer during a subsequent etching process. During this etching process the uncovered copper is dissolved in an acid or ferric chloride bath. Finally, the still remaining hardened film is dissolved exposing the protected copper in the desired circuit pattern. Also known is stencil etching wherein the circuit pattern is applied by a suitable printing process such as silk screening. The protective covering, usually an enamel, is then dried and the exposed copper is etched as described above.

Another well known method for printed circuit production entails a plating process wherein a plastic laminate such as a paper-base phenolic is coated with an electrically conductive layer such as a silver film deposited in the same way that mirrors are silvered. The silver film is then coated with a plating resist, usually an enamel, by a stenciling process, leaving exposed areas to form the circuit pattern. A copper layer is then deposited and the plating resist removed by a solvent. Finally, the exposed silver film is removed by acid etching, leaving the thicker copper layer to form the desired circuit pattern on the plastic sheet.

Although these known processes are in wide use for an extensive variety of applications, a need exists for improved methods of printed circuit production. A particular need exists for a process capable of improving the precision with which printed circuitry can be produced. As noted above, this requirement for circuit precision is particularly acute in the ever enlarging field of miniaturized electronic systems.

The object of this invention, therefore, is to provide an improved process suitable for the production of intricate and highly precise miniature printed circuits.

CHARACTERIZATION OF THE INVENTION

The invention is characterized by the provision of a process for making electrical circuits including the steps of depositing a layer of photoconductive material on a substrate, exposing the latent image of an electrical circuit on the photoconductive material, and subjecting the latent image to a developer substance that develops the image by depositing a layer of electrically conductive material thereon. Because of the limited number of required procedural steps and the extremely high image resolution attainable, this process can easily and relatively inexpensively produce extremely exact, miniaturized printed circuits.

A feature of this invention is the provision of a process of the above type wherein the photoconductive material comprises titanium dioxide. Unexpectedly high quality circuits are produced by utilizing titanium dioxide in the above described process.

Another feature of this invention is the provision of a process of the above featured type wherein electrical component receptacles are formed in the substrate so as to facilitate mounting of electrical components suitable for connection in the developed circuit image.

The invention is characterized further by the provision of an electrical circuit formed as described above and including a substrate, a layer of photoconductive material deposited on the substrate, and an electrically conductive circuit image photographically developed on the surface of the photoconductive layer and adapted for connection to a source of electrical power.

These and other objects and features of the present invention will become more apparent upon a perusal of the following specification taken in conjunction with the accompanying drawings wherein.

Figures 1, 3:
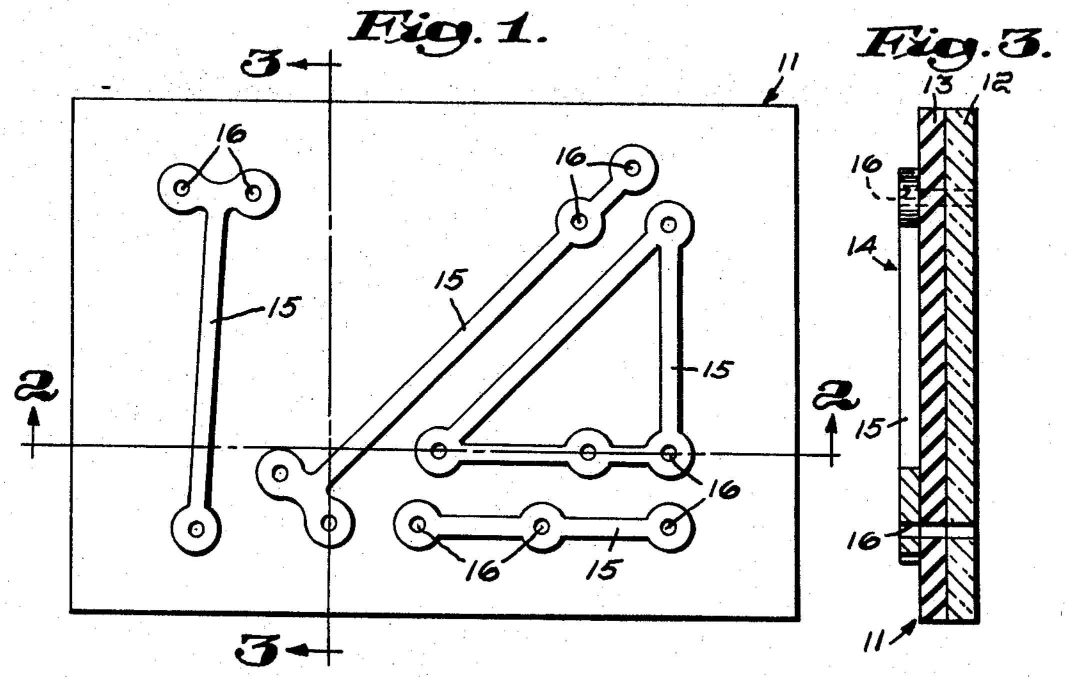
FIG. 1 is a plane view of a preferred embodiment of the invention.
FIG. 3 is a cross-sectional view taken along lines 3—3 of FIG. 1.
Figure 2:
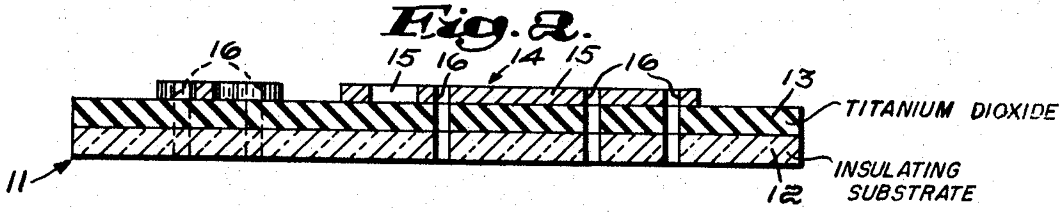
FIG. 2 is a cross-sectional view taken along lines 2—2 of FIG. 1.

Referring now to the Figs., there is shown the circuit board 11 including the substrate 12 comprising, for example, a plastic laminate such as a paper-base phenolic. Deposited on the substrate 12 is the film layer 13 of photoconductive material, preferably, titanium dioxide. The electrically conductive circuit image 14 including the conductive paths 15 is formed on the surface of the photoconductive film layer 13. Extending through the substrate 12 and the film layer 13 are the plurality of receptacle openings 16 adapted to receive electrical components suitable for connection in the circuit 14.

In a typical example of the invention, a photoconductive layer 13 of titanium dioxide is coated on a substrate 12 composed of a paper-base phenolic. The surface of the photoconductive layer 13 is then exposed to a source of ultraviolet radiation having a pattern that conforms to the desired circuit 14. Exposure to this pattern of ultraviolet radiation uniformly activates the exposed portions of the photoconductive layer 13 creating a latent image of the circuit 14. Next, the surface of the photoconductive layer 13 is contacted with a developer solution of silver nitrate followed by a solution of Metol (methyl-para-aminophenol sulphate). This development process produces precipitation of silver metal on the exposed portions of the photoconductive layer 13 thereby forming the electrically conductive circuit image 14. More detailed descriptions of processes suitable for forming the circuit image 14 appear in copending U.S. application Ser. No. 199,211 filed May 14, 1962 now abandoned; U.S. Pat. Nos. 3,152,903 and 3,052,541; and French Pat. Nos. 345,206 and 1,245,215.

Other photoconductor or photocatalyst materials preferred in this invention include other metal containing photoconductors. A preferred group of such photosensitive materials are inorganic materials such as compounds of a metal and a non-metallic element of Group VIA of the periodic table including oxides such as zinc oxide, titanium dioxide, zirconium dioxide, germanium dioxide, indium trioxide, tin oxide, barium titanate; metal sulfides such as cadmium sulfide, zinc sulfide, and tin disulfide; and metal selenides such as cadmium selenide. Metal oxides are especially preferred photoconductors of this group. Titanium dioxide is a preferred metal oxide because of its relatively low electrical conductivity. Titanium dioxide having an average particle size less than about 250 millimicrons and which has been treated in an oxidizing atmosphere at a temperature between about 200° and 950° C for from about 0.5 hours to about 30 hours is especially preferred, and more especially, that titanium dioxide produced by high temperature pyrolysis of titanium halide.

While the exact mechanism by which the photoconductors of this invention are sensitized is not known, it is believed that exposure of the photoconductor or photocatalyst to activating means causes an electron or electrons to be transferred from the valance band of the photoconductor or photocatalyst to the conductance band of the same or at least to some similar excited state whereby the electron is loosely held, thereby changing the photoconductor from an inactive form to an active form. If the active form of the photoconductor is in the presence of an electron accepting compound, a transfer of electrons will take place between the photoconductor and the electron accepting compound, thereby reducing the electron accepting compound. Therefore a simple test which may be used to determine whether or not materials have a photoconductor or photocatalytic effect is to mix the material in question with an aqueous solution of silver nitrate. Little, if any, reaction should take place in the absence of light. The mixture is then subjected to light. At the same time a control sample of an aqueous solution of silver nitrate alone is subjected to light, such as ultraviolet light. If the mixture darkens faster than the silver nitrate alone, that material is a photoconductor.

Other materials which are useful for forming the circuit images 14 in this invention are those such as described in U.S. Pat. No. 3,152,903 and in copending application Ser. No. 199,211. These image-forming materials include preferably an oxidizing agent and a reducing agent. Such image-forming materials are often referred to in the art as physical developers. The oxidizing agent is generally the image-forming component of the image-forming material. However, this is not necessarily true. Preferred oxidizing agents comprise the reducible ions of electrically conductive metals and having at least the oxidizing power of cupric ion. The oxidizing agents of this invention, however, include such metal ions as $Ag^{+}$, $HG^{+2}$, $Pb^{+4}$, $Au^{+3}$, $Pt^{+4}$, $Ni^{+2}$, $Sn^{+2}$, $Pb^{+2}$, $Cu^{+1}$, and $Cu^{+2}$.

The reducing agent components of the circuit image-forming materials of this invention include organic compounds such as the oxalates, formates, substituted and unsubstituted hydroxylamine, and substituted and unsubstituted hydrazine, ascorbic acid, aminophenols, and the dihydric phenols. Also, polyvinylpyrrolidone, alkali and alkaline earth metal oxalates and formates are useful as reducing agents. Suitable reducing compounds include hydroquinone or derivatives thereof, o- and p-aminophenol, p-methylaminophenol sulfate, p-hydroxyphenyl glycine, o- and p-phenylene diamine, and 1-phenyl-3-pyrazolidone.

Additional circuit image-forming materials useful in this invention are taught in U.S. Pat. No: 3,106,156 wherein a metal is deposited electrolytically on activated portions of the photoconductor. Furthermore, the image-forming materials or physical developers may contain organic acids which can react with metal ions to form complex metal anions. Also, the developers may contain other complexing agents and the like to improve image formation and other properities found to be desirable in this art.

Additional stabilizing and fixing steps such as known to the art may also be added to the processes of this invention in order to increase the life and permanence of the circuit image produced.

Other irradiation sources which are useful in this invention for producing the latent image of the desired circuit include any activating electromagnetic radiation. Thus actinic light, x-rays, or gamma rays are effective in exciting the photoconductor. Beams of electrons and other like particles may also be used in the place of the ordinary forms of electromagnetic radiation for forming the circuit image according to this invention.

Furthermore, the photoconductor layer 13 may be sensitized to visible and other wavelengths of light by foreign ion doping, addition of fluorescent materials, and/or by means of sensitizing dyes. Bleachable dyes useful for sensitizing the photoconductors of this invention include, for example, the cyanine dyes, the dicarbocyanine dyes, the carbocyanine dyes, and the hemicyanine dyes such as disclosed in commonly assigned copending U.S. application Ser. No. 633,689 filed Apr. 26, 1967. In certain applications, the ability to use visible light can simplify the circuit image exposure step.

The substrate 12 for the photoconductive layer 13 can comprise any suitable material of sufficient strength and durability to satisfactorily serve as a printed circuit base. Suitable materials include, for example, wood, rag content paper, pulp paper, plastics such as, for example, polyethylene terephthalate (Mylar) and cellulose-acetate, cloth, metal such as aluminum, and glass. When electrolytic physical development is employed, then the substrate 12 generally must be electrically conducting.

Figure 4:
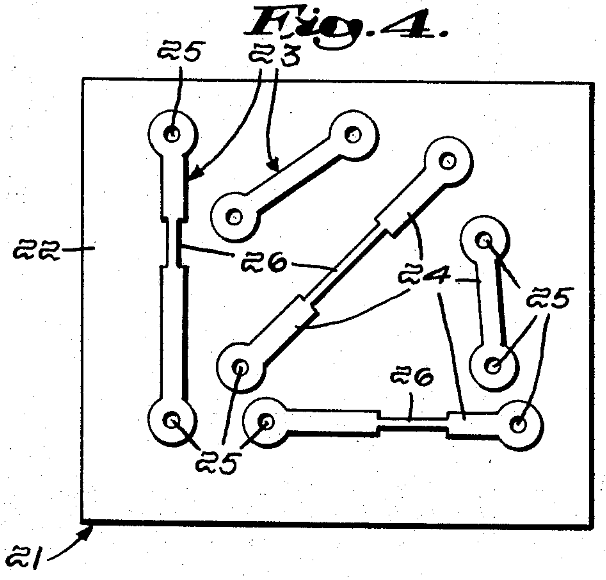
FIG. 4 is a plane view of a preferred embodiment of the invention.

Referring now to FIG. 4, there is shown another circuit board embodiment 21 comprising a circuit image photographically developed on the photoconductive material layer 22. Forming the circuit image are the plurality of circuit paths 23. Again, the board 21 is provided with recepticle openings 25 suitable for receiving electrical components. Included in the circuit paths 23 are discrete conductor path portions 24 and resistor path portions 26.

The circuit board 21 is produced as described above. However, during exposure of the circuit image, the conductor portions 24 are subjected to a higher level of sensitizing energy than are the resistor portions 26. Thus, during development, free metal is precipitated more densely upon the conductor portions 24 than on the resistor portions 26. Accordingly, the specific electrical resistance of the conductor portions 24 is made substantially greater than those of the resistor portions 26 which preferably have specific resistances of greater than $10^{-5}$ ohm-centimeters so as to function as electrical resistors. Naturally, the precise resistivity of the resistors 26 is controlled by the level of applied sensitizing energy. It will be appreciated that other processes can also be used to develop circuits of varying resistivity. For example, a uniformly exposed circuit image can be developed into discrete paths of varying resistivity by a plurality of sequential development steps. In this case, the development steps are accomplished with developers comprising the reducible ions of distinct metals having different electrical resistivity characteristics.

Obviously, many modifications and variations of the present invention are possible in light of the above teachings. It is to be understood, therefore, that within the scope of the appended claims the invention can be practiced otherwise than as specifically described.

What is claimed is:

1. A process for making electrical circuits comprising the steps of exposing a medium comprising a layer of photoconductive titanium dioxide which becomes reversibly activated upon exposure, thereby becoming capable of causing chemical reactions in exposed portions and thereby forming an image of an electrical circuit on said layer of photoconductive material, and contacting said image with a developer substance which undergoes an oxidation/reduction type reaction upon contact with the exposed activated photoconductive material and that deposits thereon an electrically conductive metal layer and including the step of forming receptacles adapted to receive electrical components suitable for connection in said circuit.

2. A process according to claim 1 wherein said developing step comprising contacting the image with a developer comprising metal ions.

3. An electrical device comprising a layer of photoconductive material which becomes reversibly activated upon exposure, thereby becoming capable of causing chemical reactions in exposed portions and an electrically conductive metal circuit image photographically developed on said layer and adapted for connection to a source of electrical power and wherein said device comprises receptacle means adapted to receive electrical components suitable for connection to said circuit image.

4. An electrical device according to claim 3 wherein said photoconductive material comprises titanium dioxide.

5. An electrical device comprising a layer of photoconductive material which becomes reversibly activated upon exposure, thereby becoming capable of causing chemical reactions in exposed portions and an electrically conductive metal circuit image photographically developed on said layer and adapted for connection to a source of electrical power wherein said circuit image comprises a plurality of discrete path portions of varying specific resistance.

6. An electrical device according to claim 5 wherein said photoconductive material comprises titanium dioxide.

7. An electrical device according to claim 6 wherein said substrate comprises receptacle means adapted to receive electrical components suitable for connection to said circuit image.

8. A process for making electrical circuits comprising the steps of exposing a medium comprising a layer of photoconductive material which becomes reversibly activated upon exposure, thereby becoming capable of causing chemical reactions in exposed portions and thereby forming an image of an electrical circuit on said layer of photoconductive material, and contacting said image with a developer substance which undergoes an oxidation/reduction type reaction upon contact with the exposed activated photoconductive material and that deposits thereon an electrically conductive metal layer and wherein said exposing step comprises forming physically developable images of both conductors and resistors on said photoconductive layer.

9. A process according to claim 8 wherein said exposing step comprises exposing to one level of activating energy, to form an image of conductors, and exposing to a lower level of activating energy to form an image of resistors.

10. An electrical device comprising a layer of photoconductive material which becomes reversibly activated upon exposure, thereby becoming capable of causing chemical reactions in exposed portions and an electrically conductive metal circuit image photographically developed on said layer and adapted for connection to a source of electrical power and wherein said photoconductive material comprises titanium dioxide having a particle size less than about 250 millimicrons.

* * * * *